United States Patent
Aikawa et al.

[11] Patent Number: 6,110,272
[45] Date of Patent: Aug. 29, 2000

[54] METHOD FOR PRODUCING SILICON SINGLE CRYSTAL

[75] Inventors: Katsunori Aikawa, Kishima-gun; Kuniharu Inoue, Amagasaki, both of Japan

[73] Assignee: Sumitomo Sitix Corporation, Amagasaki, Japan

[21] Appl. No.: 09/162,133

[22] Filed: Sep. 29, 1998

[30] Foreign Application Priority Data

Sep. 29, 1997 [JP] Japan ................................. 9-282718

[51] Int. Cl.$^7$ ................................................ C30B 15/20
[52] U.S. Cl. ................................ 117/13; 117/18; 117/30; 117/33
[58] Field of Search ................................. 117/13, 18, 30, 117/33

[56] References Cited

U.S. PATENT DOCUMENTS

| | | | |
|---|---|---|---|
| 5,462,010 | 10/1995 | Takano et al. | 117/14 |
| 5,588,993 | 12/1996 | Holder | 117/13 |
| 5,814,148 | 9/1998 | Kim et al. | 117/13 |
| 5,902,395 | 5/1999 | Nagai et al. | 117/18 |
| 5,919,303 | 7/1999 | Holder | 117/13 |

FOREIGN PATENT DOCUMENTS 5-32479  9/1993  Japan.

*Primary Examiner*—Felisa Garrett
*Attorney, Agent, or Firm*—Oblon, Spivak, McClelland, Maier & Neustadt, P.C.

[57] ABSTRACT

A method of loading a crucible, comprises loading at least one polycrystalline silicon rod into the crucible. Lump and/or granular polycrystalline silicon may also be loaded into the crucible. Especially when loaded into the crucible in a close-packed pyramidal configuration, a high loading density is achieved.

9 Claims, 3 Drawing Sheets

METHOD FOR PRODUCING SILICON SINGLE CRYSTAL

BACKGROUND OF THE INVENTION

1. Field of the Invention

The present invention relates to a method for producing a silicon single crystal by the Czochralski method, and more particularly, to a method for producing a silicon single crystal comprising the step of melting a raw material polycrystalline silicon in a crucible to produce a silicon melt for producing a silicon single crystal by the Czochralski method.

2. Discussion of the Background

When a silicon single crystal is produced by the Czochralski method, polycrystalline silicon is loaded into a crucible, melted to produce a desired quantity of silicon melt, and a single crystal is pulled from this silicon melt. This general process is well known to those of ordinary skill in the art, and is described in "Semiconductor Device Fundamentals", *Crystal Growth*, Robert. F. Pierret, pp. 16–18 (Addison-Wesley, 1996), as well as "Encyclopaedia of Chemical Technology", *Crystal Growth*, Kirk-Othmer, 4th ed., pp. 1092–1095 (John Wiley & Sons, 1997), both incorporated herein by reference.

Polycrystalline silicon used here as the raw material for producing a silicon single crystal is typically obtained by the Siemens method, which is considered excellent in production efficiency. The Siemens method is well known, and is described in "Encyclopaedia of Chemical Technology", *High Purity Silicon Preparation*, Kirk-Othmer, 4th ed., pp. 1090–1092 (John Wiley & Sons, 1997). The polycrystalline silicon rod is used as the raw material for producing a silicon single crystal, after the rod has been crushed by thermal shock or mechanical shock, etching, cleaning, and classifying.

More specifically, polycrystalline silicon lumps of the size between 45 and 85 mm, known as L-size, and polycrystalline silicon lumps of the size between 5 and 45 mm, known as S-size, are mainly used. Furthermore, small polycrystalline silicon pieces formed during the production of these polycrystalline silicon lumps, known as chips, or polycrystalline silicon granules produced by the fluidizing granulation method, are also used as the raw materials for producing silicon single crystals.

In melting the raw material for silicon single crystals, it is necessary to load as much of the raw materials into the crucible as possible, in order to produce a single crystal of as large a weight as possible.

To meet this requirement, increasing the size of the crucible has been considered. However, increasing the size of the crucible is not a preferred method, because if the size of the crucible is increased, the electric-power required for melting the raw materials will increase accordingly, and control of the melt temperature will become difficult.

Another method is to increase the height of the loading level of the raw materials in the crucible in order to increase the total quantity of raw materials loaded. For example, it is effective to stack the raw materials 2(lumps and/or granules); in the vicinity of the upper end of the crucible 1 as shown in FIG. 3(a). However, if the raw materials 2 are melted under these conditions, since the upper end of the crucible 1 is located far above the heater parts 4, the raw materials 2 situated in the vicinity of the upper end of the crucible 1 do not melt completely, and stick on the internal wall surface of the crucible 1 as shown in FIG. 3(b). As a result, as FIG. 3(c) shows, the upper end of the crucible 1 deforms inwardly, which causes a decrease in the life of the crucible 1 and the dislocation of the single crystal. Therefore, increasing the raw material level in the crucible is also not a preferred method.

In order to increase the quantity of the raw materials loaded into the crucible under such situations, the loading density must be increased. From this point of view, in actual operation, after L-size and S-size lump materials are loaded, chips or granular materials are often also loaded so as to fill the gaps between block materials. This loading method is advantageous from the point of view of raw material cost reduction through the effective use of the chips.

However, even such a loading method is not fully effective in increasing the amount of raw materials loaded. This is because many gaps remain between pieces of raw materials due to the large surface area of each piece of raw material. Therefore, the quantity of the polycrystalline silicon loaded into the crucible is still limited, and the production of a single crystal of large weight is difficult.

SUMMARY OF THE INVENTION

An object of the present invention is to provide a method for producing a silicon single crystal which, in the step of melting polycrystalline silicon prior to pulling the silicon single crystal, increases the quantity of the raw materials loaded into the crucible as it is, and reduces the electric power costs required for melting, without increasing the size of the crucible and elevating the level of the loaded raw materials, thereby enabling it to economically produce a heavy silicon single crystal.

To achieve the above and other objects, a method for producing a silicon single crystal according to the present invention includes a method which loads polycrystalline silicon rods into the crucible, melts the polycrystalline silicon rods, and pulls a silicon single crystal from the molten silicon.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE INVENTION

Figure 1A:
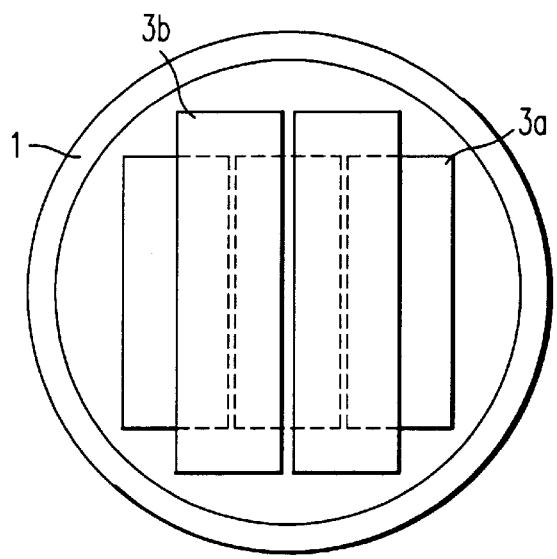
FIG. 1 is a schematic diagram of a first embodiment of the present invention; (a) being a plan view, (b) being a front view, and (c) being a side view thereof.

When the weight for the same volume is compared, a polycrystalline silicon rod is heavier than polycrystalline silicon granules. Therefore, using polycrystalline silicon rods, the loading density of the raw material in the crucible increases. Moreover, even the time required for melting the raw materials decreases for the following reasons:

Many gaps are present between the particles of raw materials when only granular materials are loaded and melted in a crucible, and therefore the thermal conductivity is poor, and a considerably long period of time is required to melt the raw materials. When rod materials are loaded and melted, the time required for melting the raw materials is reduced as a whole even though the thermal capacity has increased, because the rod material, consisting of a single body without gaps, has essentially a high thermal conductivity.

The reason why polycrystalline silicon rods have not been used as they are as the raw material for producing silicon single crystals has simply been that it was considered that the thermal capacity of the rod material was large, and would increase the time required for melting.

In the method for producing a silicon single crystal according to the present invention, a plurality of polycrystalline silicon rods are loaded in a close-packed pyramidal configuration in a crucible, and lumps and/or granular polycrystalline silicon are loaded around the polycrystalline silicon rods in a crucible, to improve the density of the raw material and amount in the crucible and to shorten the time required for melting the raw materials.

When a plurality of polycrystalline silicon rods are loaded in a close-packed pyramidal configuration in a crucible, the horizontal placement in which a plurality of polycrystalline silicon rods are horizontally placed on the bottom of the crucible and vertically stacked, or the vertical placement in which a plurality of polycrystalline silicon rods are vertically placed and horizontally arranged may be used. In the former horizontal placement, since the circumference of the bottom of the crucible has a curved shape, it is preferred to increase the raw material loading density to arrange relatively short polycrystalline silicon rods on the bottom, and to stack longer polycrystalline silicon rods on the short polycrystalline silicon rods.

The embodiments of the present invention will be described referring to the drawings.

Figure 1B:
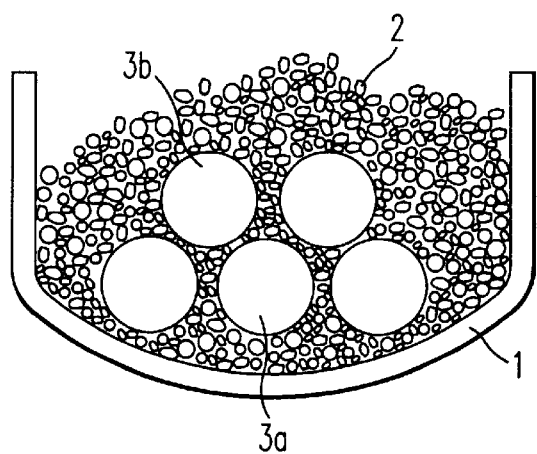
Figure 1C:
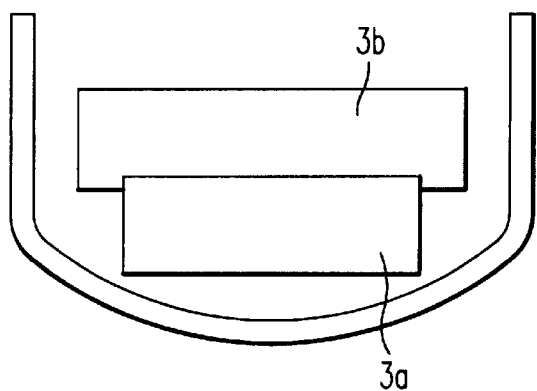

FIG. 1 shows a first embodiment of the present invention. In this embodiment, ordinary raw materials 2, which made from polycrystalline silicon lumps and/or granules, are placed on the bottom of the crucible 1. The circumference of the bottom of the crucible 1 has a curve.

After the placement of the ordinary raw materials 2, three polycrystalline silicon rods 3a (hereafter referred to as rod materials 3a) which have been cut from a polycrystalline silicon rod produced by the Siemens method, are laid horizontally and arranged in parallel. At this time, the rod materials 3a are placed so as to be buried in the ordinary raw materials 2 as much as possible.

After arranging the rod materials 3a, the ordinary raw materials 2 are loaded so that a substantial part of the rod materials 3a are buried in the ordinary raw materials 2. On these materials, two longer polycrystalline silicon rods 3b (hereafter referred to as rod materials 3b) which have been cut from a polycrystalline silicon rod produced by the Siemens method, are laid horizontally in a close-packed pyramidal configuration, on which the lumps 2 and granules 4 are loaded to a predetermined level. The lower rod materials 3a are shorter than the upper rod materials 3b.

The rod materials 3a and 3b are efficiently loaded into the crucible 1 without interference of the curved bottom of the crucible 1. That is, if only long rod materials 3b were used, they would not stack into two rows, and if only short rod materials 3a were used, they could be stacked in two rows, but a large space would be produced off the ends of the rod materials of the upper row.

Once the raw material is charged in the crucible 1, the raw material in the crucible 1 is melted by supplying electric power to a heater installed around the crucible 1. In this embodiment, although the number of rods of rod materials 3a and 3b is five, the total number of rods is not so limited, the number may be at least one, or greater than five, and all values in between.

Figure 2A:
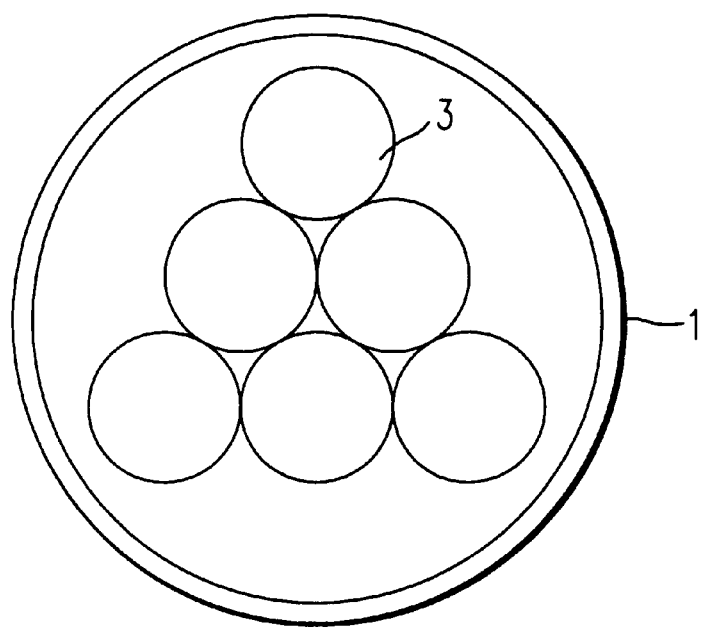
FIG. 2 is a schematic diagram of a second embodiment of the present invention; (a) being a plan view, and (b) being a front view.
Figure 2B:
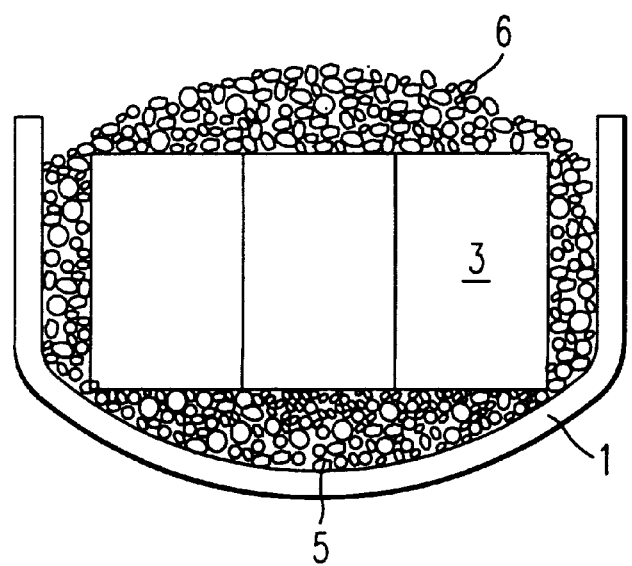

FIG. 2 shows a second embodiment of the present invention. In the second embodiment, especially fine lump materials, known as SS chips 5, are first placed on the bottom of the crucible 1, so that the upper level of the SS chips 5 is flat. Next, six rod materials are placed vertically on the SS chips 5, and arranged in a close-packed pyramidal configuration in the horizontal direction. The gaps between the rod materials 2 are filled with the ordinary lump materials 6 to a predetermined level. SS chips are placed on the bottom of the crucible 1 to prevent rod materials 3 from falling over.

After the raw materials have been loaded into the crucible 1, the raw materials in the crucible 1 are melted by applying electric power to the heater installed around the crucible, and a single crystal is pulled up from the molten material. In this embodiment, although the number of rod materials 3 is six, the total number of rods is not so limited; the number may be at least one, or greater than six, and all values in between.

Having generally described this invention, a further understanding can be obtained by reference to certain specific examples which are provided herein for purposes of illustration only and are not intended to be limiting unless otherwise specified. The examples of the present invention will be shown below to demonstrate the advantages of the present invention by comparing these examples with comparative examples.

EXAMPLES

Figure 3A:
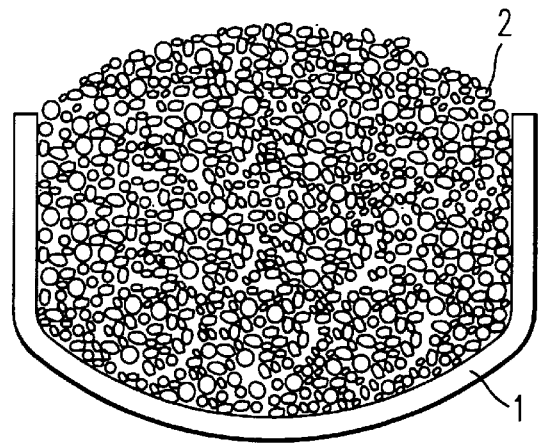
FIG. 3 is a schematic diagram illustrating problems which arise when raw materials are excessively loaded.
Figure 3B:
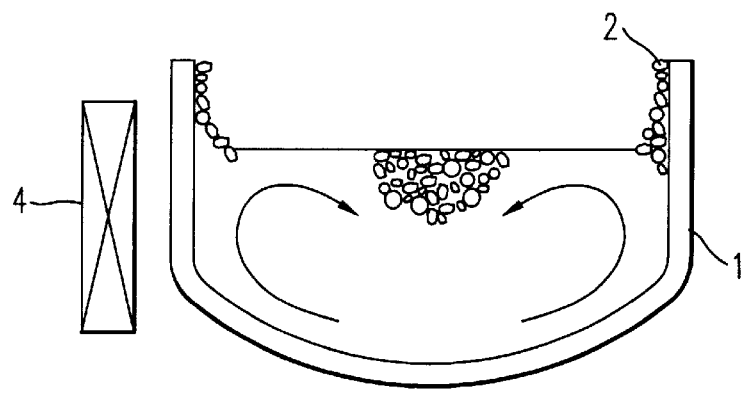
Figure 3C:
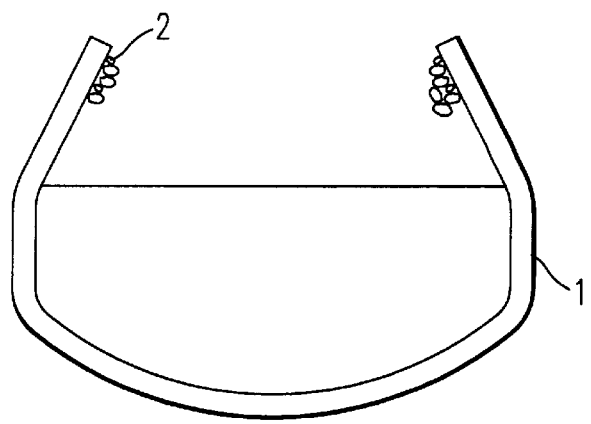

When polycrystalline silicon was melted using a quartz crucible having a diameter of 22 inches, no rods were used as polycrystalline silicon source, and as much of the raw materials were loaded as possible, ignoring possible deformation of the crucible (FIG. 3). Although the blend ratio of lumps and granules were adjusted, the loading weight was limited to about 100 kg. The time required for melting was 10 hours or more when the electric power supplied to the heater was 100 kW.

When the amount of polycrystalline silicon was loaded so as not to cause the deformation of the crucible (FIG. 3), the loading weight decreased to about 80 kg. The time required for melting was about 9 hours at the same electric power supplied to the heater. Although the time required for melting was decreased when the electric power supplied to the heater was increased, increasing the electric power was undesirable as a means to shorten the time required for melting, because the damage of the crucible (increase in the quantity of crucible melting, the softening and deformation of the crucible, etc.) increased.

When five material rods 3a, 3b were used in combination according to the first embodiment shown in FIG. 1, even through the raw materials were loaded to the level not to cause the deformation of the crucible (FIG. 3), 120 kg of the raw materials could be loaded, and the time required for melting the raw materials was shortened to about 8 hours with the same electric power supplied to the heater.

When six material rods 3 were used according to the second embodiment shown in FIG. 2, 120 kg of the raw materials could also be loaded, and the time required for melting the raw materials was shortened to about 9 hours.

As described above, since the method for producing a silicon single crystal according to the present invention increases the amount of raw material loaded into the crucible by the use of polycrystalline silicon rods, a larger quantity of the raw materials can be loaded in the crucible without increasing the size of the crucible and the raw material loading level in the crucible, enabling the production of a silicon single crystal of large weight. Moreover, the electric power costs required for melting the raw materials can be reduced despite the increase in quantity of raw materials loaded into the crucible, and thereby the manufacturing costs of silicon single crystals can be reduced. The single crystal of silicon ingot may be formed into wafers, and fabricated into semiconductor devices. Device fabrication is well known to those of ordinary skill in the art, and is described in "Semiconductor Device Fundamentals", *Basics of Device Fabrication*, Robert. F. Pierret, pp. 149–174 (Addison-Wesley, 1996).

Obviously, numerous modifications and variations of the present invention are possible in light of the above teachings. It is therefore to be understood that within the scope of the appended claims, the invention may be practiced otherwise than as specifically described herein.

What is claimed is:

1. A method of loading a crucible, comprising:
   loading a plurality of polycrystalline silicon rods into said crucible; and
   loading at least one selected from the group consisting of lump polycrystalline silicon, granular polycrystalline silicon, and a mixture thereof into said crucible;
   wherein said plurality of polycrystalline silicon rods are loaded into said crucible in a close-packed pyramidal configuration.

2. The method of claim 1, wherein at least one of said lump or granular polycrystalline silicon is at least one member selected from the group consisting of L-size, S-size, and granules.

3. The method of claim 1, wherein said plurality of polycrystalline silicon rods are loaded into said crucible horizontally or vertically.

4. The method of claim 1, further comprising:
   loading said crucible with at least one selected from the group consisting of lump polycrystalline silicon, granular polycrystalline silicon, and a mixture thereof, prior to loading said plurality of polycrystalline silicon rods; and
   loading at least one selected from the group consisting of lump polycrystalline silicon, granular polycrystalline silicon, and a mixture thereof, into said crucible, after loading said plurality of polycrystalline silicon rods.

5. The method of claim 1, wherein said polycrystalline silicon rods have been prepared by the Siemens method.

6. A method of forming a melt of silicon, comprising:
   loading a crucible by the method of claim 1; and
   heating said crucible, to melt said polycrystalline silicon rods.

7. A method of forming a silicon single crystal, comprising:
   forming a melt of silicon by the method of claim 6; and
   growing a single crystal of silicon from said melt by the Czochralski method.

8. A method of forming a silicon single crystal wafer, comprising:
   forming a silicon single crystal by the method of claim 7; and
   cutting a wafer from said silicon single crystal.

9. A method of forming a semiconductor device, comprising:
   forming a silicon single crystal wafer by the method of claim 8; and
   forming a semiconductor device from said wafer.

* * * * *